United States Patent
Olsson

(10) Patent No.: US 10,972,149 B2
(45) Date of Patent: Apr. 6, 2021

(54) SURFACE WAVE INTERFERENCE REDUCTION

(71) Applicant: TELEFONAKTIEBOLAGET LM ERICSSON (PUBL), Stockholm (SE)

(72) Inventor: Bengt-Erik Olsson, Mountain Lakes, NJ (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/259,039

(22) Filed: Jan. 28, 2019

(65) Prior Publication Data
US 2020/0244311 A1    Jul. 30, 2020

(51) Int. Cl.
| | |
|---|---|
| *H04B 3/52* | (2006.01) |
| *H01P 3/10* | (2006.01) |
| *H04B 3/54* | (2006.01) |
| *H04B 3/56* | (2006.01) |
| *H04B 7/02* | (2018.01) |
| *G01R 31/08* | (2020.01) |

(52) U.S. Cl.
CPC ............. *H04B 3/52* (2013.01); *G01R 31/085* (2013.01); *H01P 3/10* (2013.01); *H04B 3/542* (2013.01); *H04B 3/56* (2013.01); *H04B 7/02* (2013.01); *H04B 2203/5404* (2013.01)

(58) Field of Classification Search
CPC . H04B 3/52; H04B 3/542; H04B 3/56; H04B 7/02; H04B 2203/5404; G01R 31/085; H01P 3/10
USPC .......................................................... 333/240
See application file for complete search history.

(56) References Cited

U.S. PATENT DOCUMENTS

| | | | |
|---|---|---|---|
| 7,009,471 B2 | 3/2006 | Elmore | |
| 10,396,853 B1 | 8/2019 | Olsson et al. | |
| 2005/0111533 A1 | 5/2005 | Berkman et al. | |
| 2019/0280737 A1* | 9/2019 | Henry | H01Q 13/02 |

* cited by examiner

*Primary Examiner* — Benny T Lee
*Assistant Examiner* — Hafizur Rahman

(57) ABSTRACT

The present disclosure relates to a surface wave communication system comprising a surface wave conduit and being adapted for transmitting electromagnetic surface wave signals via the surface wave conduit. The surface wave communication system further comprises at least one interference cancelling system, where each interference cancelling system comprises an antenna arrangement and a cancelling device. The cancelling device is adapted to:
  input antenna signal components from the corresponding antenna arrangement in at least one corresponding antenna branch,
  input conduit signal components from the surface wave conduit in a conduit branch, to remove adapted antenna signal components from the conduit signal components such that recovered conduit signal components are obtained, and to
  output the recovered conduit signal components.

12 Claims, 4 Drawing Sheets

SURFACE WAVE INTERFERENCE REDUCTION

TECHNICAL FIELD

The present disclosure relates to communication systems using surface wave propagation, and in particular to interference reduction.

BACKGROUND

In next generation mobile access systems, there is a need for densification of the radio base stations (RBS) that connect mobile users and devices to the mobile core network. A major issue with densification in a city environment is to find sites for mounting radio base stations. The conventional approach of mounting RBSs on roof tops and towers will not always be viable, since it is difficult to, e.g., negotiate contracts with so many property owners. The propagation properties of radio signals at mm-wave also favors deployment close to the users.

An attractive solution is to approach owners of existing city environment infrastructure, such as utility poles, light poles, street furniture etc. where there is a single owner that can provide installation space in many locations with a single contract. However, an issue is how to provide backhaul to the RBSs that now may sit in locations where there are no fiber connections available. Microwave point-to-point links can be used to backhaul radio base stations. However, frequency licenses can be difficult and costly to obtain.

In some parts of the world, e.g. north and south America, it is common to have utility poles along the streets for holding power line wires, transformers and other equipment related to power supply for nearby homes and businesses. These power line wires are conduits which can be used for backhauling by transmission and reception of surface waves. In this case the power company, that usually also owns the pole, can provide the necessary infrastructure needed for providing data communication between poles.

Surface waves and surface wave transceiver systems have been investigated over a long time, but never really brought to commercial success due to lack of viable applications as well as technical difficulties. Surface waves can, in principle, be excited at any frequency but in the context of telecommunications the operating frequency is usually at frequencies above 1 GHz and can extend up to almost 100 GHz.

Radiation of surface waves into air-waves can, however, occur, and is highly undesirable since energy leaked into air can interfere with other radio equipment in the area, and since the surface wave system is likely to transmit on a very wide spectrum it is important that the radiation into is not violating regulatory requirements of output power into air. In order to avoid such violation, a relatively low power is used for the surface waves and strict requirements being used for the maximum power to be launched by a surface wave transmitter. Since the surface wave channel over reasonable wire distances has relatively low loss, such requirements do not limit the capacity of the surface wave system.

There may be high power radio transmitters in the vicinity that can interfere with the surface wave system. This is a significant issue since the surface wave system operates with low power and thus should be noise limited rather than interference limited. For example, imperfections on the wire used for propagating the surface wave will cause pick-up of radio signals in the air. In other words, the low power surface wave system may become interference limited. Thus some kind of mitigation of air borne radio interference is required.

There is thus a need for further improvements for handling interference that has been received by a surface wave system.

SUMMARY

It is an object of the present disclosure to provide an improved surface wave communication system, as well as methods for improved surface wave transmission and reception.

This object is obtained by a surface wave communication system comprising a surface wave conduit and being adapted for transmitting electromagnetic surface wave signals via the surface wave conduit. The surface wave communication system further comprises at least one interference cancelling system, where each interference cancelling system comprises an antenna arrangement and a cancelling device. Each cancelling device is adapted to input antenna signal components from the corresponding antenna arrangement in at least one corresponding antenna branch, and to input conduit signal components from the surface wave conduit in a conduit branch. Each cancelling device is further adapted to remove adapted antenna signal components from the conduit signal components such that recovered conduit signal components are obtained, and to output the recovered conduit signal components.

In this way, interference from non-surface wave signals can be cancelled and greatly improve the channel capacity of a surface wave communication system Unlike interference mitigation by using multi-channel technologies such as orthogonal frequency Division Multiplexing (OFDM), where the part of the spectrum suffering from interference can be turned off and thus reducing the total capacity of the link, transmission is allowed across the full spectrum. For example, both single channel transmission as well as OFDM can be used.

According to some aspects, the surface wave conduit is a power line wire.

In this way, existing infrastructure elements can be used.

According to some aspects, each cancelling device comprises a signal quality device that is adapted to determine an error to be minimized and to output feedback control signals, and a feedback loop arrangement that comprises an equalization device for each antenna branch and a combiner arrangement. Each equalization device is adapted to be controlled by the feedback control signals to affect phase and amplitude of the antenna signal components so as to form the adapted antenna signal components. The combiner arrangement is adapted to add the conduit signal components and the adapted antenna signal components, and the combiner arrangement is adapted to output a combined signal that is input the signal quality device.

In this way, standard components can be used.

According to some aspects, each cancelling device further comprises an antenna receiver arrangement and a conduit receiver arrangement. The antenna receiver arrangement is adapted to output the antenna signal components from a received antenna signal, having been received by said antenna arrangement, and the conduit receiver arrangement is adapted to output conduit signal components from an electrical conduit signal.

According to some aspects, the surface wave communication system further comprises a converter bridge for each interference cancelling system, Each converter bridge comprises two surface wave converter units, where each surface wave converter units is adapted to convert a surface wave transferred via the surface wave conduit to an electrical conduit signal and/or to convert an electrical conduit signal to a surface wave.

In this way, the same components can be used for more than one purpose.

According to some aspects, the antenna receiver arrangement comprises at least one antenna receiver, where each antenna receiver comprises a first down-converting device, adapted to convert signal carrier frequencies to corresponding base band frequencies, and a first band pass filter. The conduit receiver arrangement comprises at least one conduit receiver, where each conduit receiver comprises a second down-converting device, adapted to convert signal carrier frequencies to corresponding base band frequencies, and a second band pass filter.

In this way, the signal interference cancellation takes place at base band frequencies.

According to some aspects, the signal quality device comprises an error minimization unit, a data recovery arrangement and an equalizer arrangement that is connected between the combiner arrangement and the data recovery arrangement. The equalizer arrangement is adapted to be controlled by the error minimization unit to affect the frequency characteristics of the combined signal.

In this way, standard components can be used.

According to some aspects, at least one antenna arrangement comprises two or more separate antenna units that are positioned apart from each other. The antenna units are according to some aspects directed in different directions, and are according to some further aspects positioned at different heights.

According to some aspects, at least one antenna arrangement comprises an array antenna unit. This enables a more efficient and reliable reception of interference signals.

There are also disclosed herein methods associated with the above-mentioned advantages.

BRIEF DESCRIPTION OF THE DRAWINGS

The present disclosure will now be described in more detail with reference to the appended drawings, where FIG. 1 schematically illustrates a communication system based on surface wave transmission.

DETAILED DESCRIPTION

Figure 1:
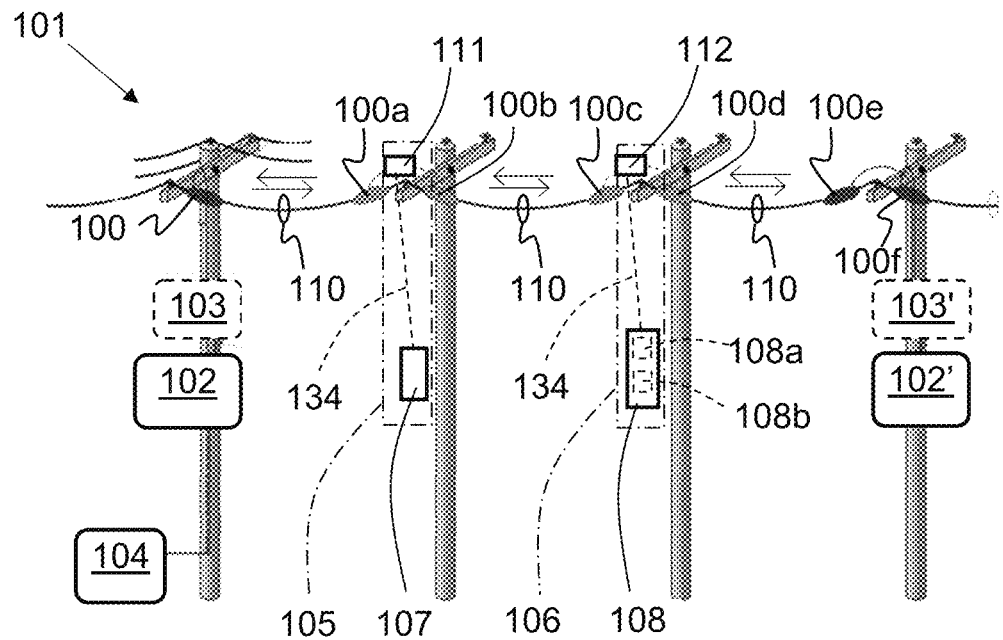

Aspects of the present disclosure will now be described more fully with reference to the accompanying drawings. The different devices, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

A surface wave converter converts an electrical field in, e.g., a coaxial cable or in a microwave waveguide into a surface wave that propagates and sustains along a conduit, such as a wire. Unlike an electromagnetic field inside a wire or waveguide, the surface wave exists and propagates on the outside of a conduit such as a wire or surface. The surface wave converter can be implemented in a low complexity fashion using, e.g., an open-ended or cut coaxial cable ending on top of the wire. Surface waves are known and will not be discussed in more detail here.

A challenge with surface wave transmission and reception is to keep the loss, i.e., insertion loss and return loss, low between the input electromagnetic field and the evolved surface wave. The loss is also partly associated with radiation into air waves where part of the signal energy is radiated as from a conventional radio antenna. This is highly undesirable since energy leaked into air can interfere with other radio equipment in the area and when the surface wave converter is used to convert an incoming surface wave into conventional electromagnetic signal, it may pick up other radio signals that can cause interference with the surface wave signal. Thus, an important aspect to consider when designing a surface wave system is the minimization of coupling between surface wave and airwave radiating radio signals into air.

A conduit of the surface wave is a medium along which the surface wave propagates. This conduit is often a wire, but it may also be a surface or other conduit. Herein, the terms conduit and wire will be used interchangeably, where interchangeable use is not intended to limit the disclosure.

FIG. 1 schematically illustrates a communication system 101 based on surface wave transmission. The communication system 101 comprises a surface wave conduit 110. The example communication system shown in FIG. 1 uses overhead power lines for transmission of the surface waves, i.e., according to aspects, the surface wave conduit 110 is a power line wire.

There is a communications interface 104 which may, e.g., be a location where a fiber connection interfaces with a core network. The fiber connection is connected to a first wireless access point 102. This first wireless access point 102 therefore has direct access to fiber backhaul and is not in need of any further backhauling.

However, a second wireless access point 102' is not in direct connection to a fiber connection which can be used for backhauling. To provide backhaul to the second wireless access point 102', surface wave propagation is used. The first wireless access point 102 is connected to a first access point surface wave converter 100, via an optional data link device 103.

The data link device 103 may comprise a modem arranged to modulate a data signal for transmission over the conduit 110 and to demodulate a data signal received over the conduit 110. Such data link devices are known and will not be discussed in more detail herein.

The wireless access point 102, or the data link device 103, transmits signals via the first access point surface wave converter unit 100 on the conduit 110 as surface waves. According to some aspects, in this example, the surface waves need to be re-generated at each power line pole, or at least at some power line poles along the way. There is arranged a converter bridge 100a, 100b; 100c, 100d comprising two surface wave converter units 100a, 100b; 100c, 100d at power line poles, here exemplified for the two central poles in FIG. 1. At each converter bridge 100a, 100b; 100c, 100d, the surface wave is converted back to an electrical signal by a surface wave converter unit, and then converted to surface wave on the next conduit in sequence. Eventually the transmission reaches the second wireless access point 102', via an optional second data link device 103' and a second access point surface wave converter unit 100e. The transmission goes both ways, i.e., to and from the communications interface from and to the second wireless access point 102'.

Each surface wave converter units 110a, 100b; 110c, 100d are adapted to convert a surface wave transferred via the surface wave conduit 110 to an electrical conduit signal 135 and/or to convert an electrical conduit signal 135 to a surface wave. It is appreciated that the electrical signals may be partly replaced by optical signals on some interfaces, but that an electrical signal is needed in order to excite the surface wave.

A backhaul signal transmission from the second wireless access point 102' towards the communication interface 104 starts out as an electrical signal (or an optical signal). The electrical or optical signal may pass via a second data link device 103' arranged as interface between the wireless access point and the surface wave communication system. The backhauling signal is converted to a surface wave by means of the second access point surface wave converter unit 100e. The surface wave travels along the conduit 110 until it reaches a pole. The surface wave is here converted by another surface wave converter 100d into an electrical signal. The electrical signal is transmitted to a surface wave converter 100c arranged on the next power line wire, which generates again a surface wave based on an electrical signal. This process continues until the transmission reaches surface wave converter 100 and the point where the communication interface 104 is arranged. According to some aspects, as shown in FIG. 1, the second access point surface wave converter unit 100e is comprised in a further converter bridge 100e, 100f.

Each surface wave converter unit is adapted for getting the signal on and off the wire, i.e. generating and collecting the surface wave. Such a surface wave converter unit is adapted to convert the electrical field in e.g. a coaxial cable or a microwave waveguide into a surface wave that propagates and sustains along the wire. Unlike an electromagnetic field inside the wire, the surface wave only exist on the outside of the wire. A surface wave converter unit can be as simple as a cut coaxial cable ending on the surface of the wire while more complex structures can be used to improve performance. However, a surface wave converter unit must allow low loss between the input electromagnetic field and the evolved surface wave, i.e. the insertion loss caused by the surface wave transducer.

Surface wave communication system s such as that illustrated in FIG. 1 are known in general and will not be discussed in more detail here.

Figure 2:
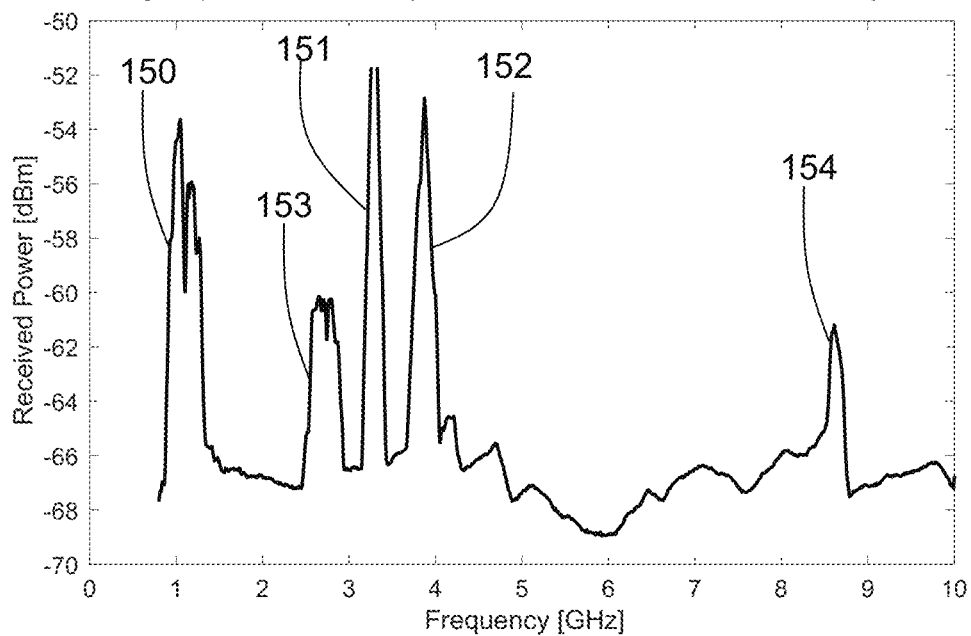
FIG. 2 shows a graphic illustration of received interference power vs. frequency.

With reference to FIG. 2, an example of a recorded signal spectrum for a 20 meter copper wire with only interference power present is shown as a function of frequency. Here, three interference signals 150, 151, 152 of higher power and two interference signals 153, 154 of lower power are shown. This example illustrates how unwanted interference signals can be picked up from the air by a wire that is used as a conduit for a surface wave, and in the following it will be device how these unwanted interference signal can be more or less cancelled. The interference signals 150, 151, 152, 153, 154 can for example be constituted by signals from both mobile systems as well as from WiFi equipment.

Figure 3:
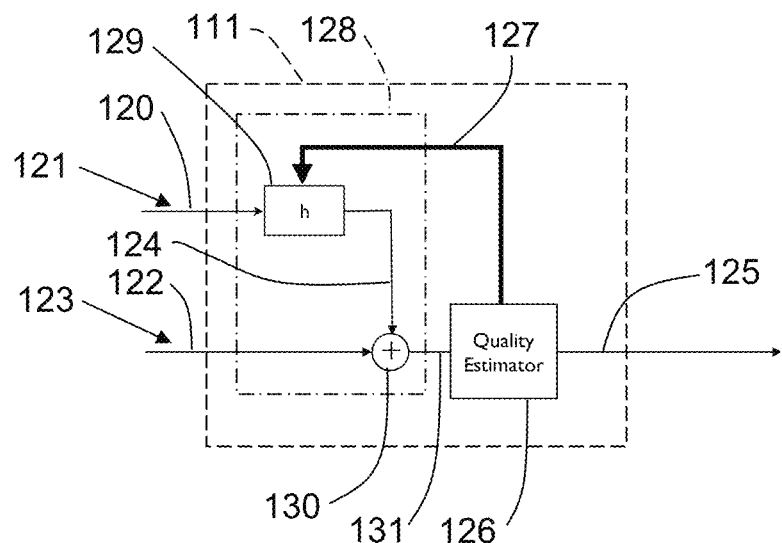
FIGS. 3-5 show different examples of cancelling devices.

According to the present disclosure, the surface wave communication system 101 further comprises a first interference cancelling system 105 and a second 106 interference cancelling system. Each interference cancelling system 105, 106 comprises a corresponding first antenna arrangement 107 and second antenna arrangement 108 and a corresponding first cancelling device 111 and second cancelling device 112. In the following, the first cancelling device 111 will be described more in detail with reference to FIG. 3. The second cancelling device 112 is of the same type as the first cancelling device 111, the following descriptive examples of the first cancelling device 111 being applicable for the second cancelling device 112 as well.

The first cancelling device 111 is adapted to input antenna signal components 120 from the first antenna arrangement 107 in an antenna branch 121, and to input conduit signal components 122 from the surface wave conduit 110 in a conduit branch 123. The first cancelling device 111 is further adapted to remove adapted antenna signal components 124 from the conduit signal components 122 such that recovered conduit signal components 125 are obtained, where the cancelling device 111, 112 is adapted to output the recovered conduit signal components 125.

In this way, interference from non-surface wave signals can be cancelled and greatly improve the channel capacity of a surface wave communication system. Unlike interference mitigation by using multi-channel technologies such as orthogonal frequency Division Multiplexing (OFDM), where the part of the spectrum suffering from interference can be turned off and thus reducing the total capacity of the link, transmission is allowed across the full spectrum. For example, both single channel transmission as well as OFDM can be used.

The first cancelling device 111 comprises a signal quality device 126 that is adapted to determine an error to be minimized and to output feedback control signals 127. The first cancelling device 111 also comprises a feedback loop 128 that in turn comprises an equalization device 129 for the antenna branch 121 and a combiner arrangement 130. The equalization device 129 is adapted to be controlled by the feedback control signals 127 of the signal quality device 126 to affect phase and amplitude of the antenna signal components 120 so as to form the adapted antenna signal components 124. The combiner arrangement 130 is adapted to add the conduit signal components 122 and the adapted antenna signal components 124, the combiner arrangement 130 being adapted to output a combined signal 131 that is input the signal quality device 126.

Figure 4:
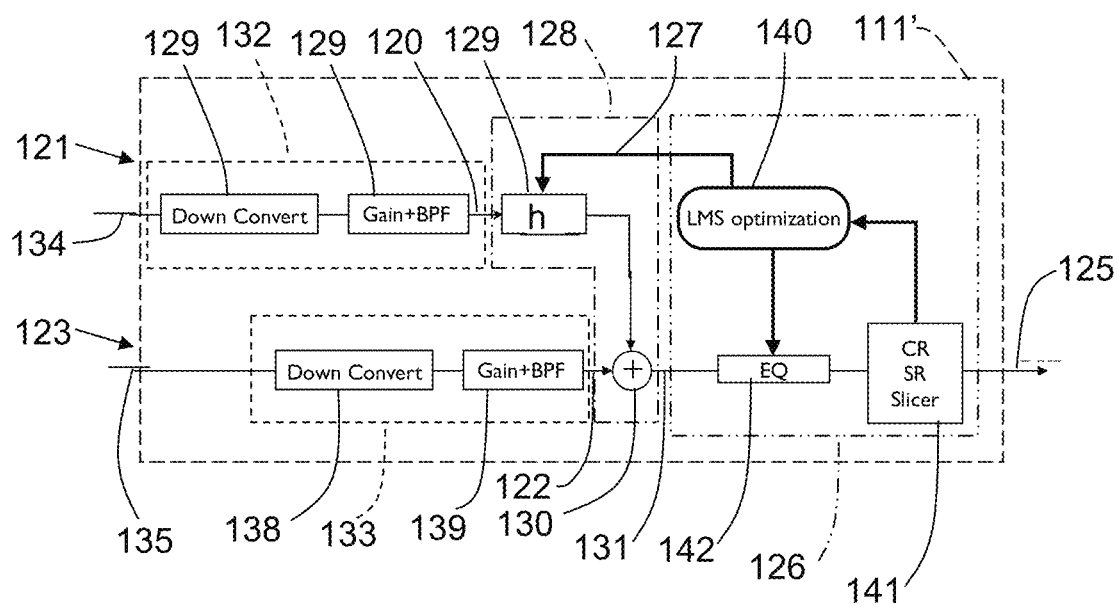

According to some aspects, with reference to FIG. 4 that shows a more detailed example based on the above, each cancelling device 111' further comprises an antenna receiver arrangement 132 and a conduit receiver arrangement 133. The antenna receiver arrangement 132 is adapted to output the antenna signal components 120 from a received antenna signal 134, having been received by the antenna arrangement 107. The conduit receiver arrangement 133 is adapted to output conduit signal components 122 from an electrical conduit signal 135.

According to some aspects, for each interference cancelling system 105, 106, there is a converter bridge 100a, 100b; 100c, 100d comprising two surface wave converter units 100a, 100b; 100c, 100d adapted to convert a surface wave transferred via the surface wave conduit 110 to an electrical conduit signal 135 and/or to convert an electrical conduit signal 135 to a surface wave as discussed previously.

According to some aspects, the antenna receiver arrangement 132 comprises an antenna receiver 132 that comprises a first down-converting device 129, adapted to convert signal carrier frequencies to corresponding base band frequencies, and a first band pass filter 137. The conduit receiver arrangement 133 comprises a conduit receiver 133 that comprises a second down-converting device 138, adapted to convert signal carrier frequencies to corresponding base band frequencies, and a second band pass filter 139.

According to some aspects, the signal quality device 126 comprises an error minimization unit 140, a data recovery arrangement 141 and an equalizer arrangement 142 that is connected between the combiner arrangement 130, 130' and the data recovery arrangement 141. The equalizer arrangement 142 is adapted to be controlled by the error minimization unit 140 to affect the frequency characteristics of the combined signal 131 and is well-known in the art. According to some aspects, straight frequency characteristics are desired.

The data recovery arrangement 141 is according to some aspects constituted by so-called carrier recovery and signal recovery slicer that is adapted to re-create the originally transmitted signal diagram and is well-known in the art. According to some aspects, the equalization device 129 is adapted to be controlled such that the data recovery arrangement 141 is enabled to re-create the originally transmitted signal diagram.

Figure 5:
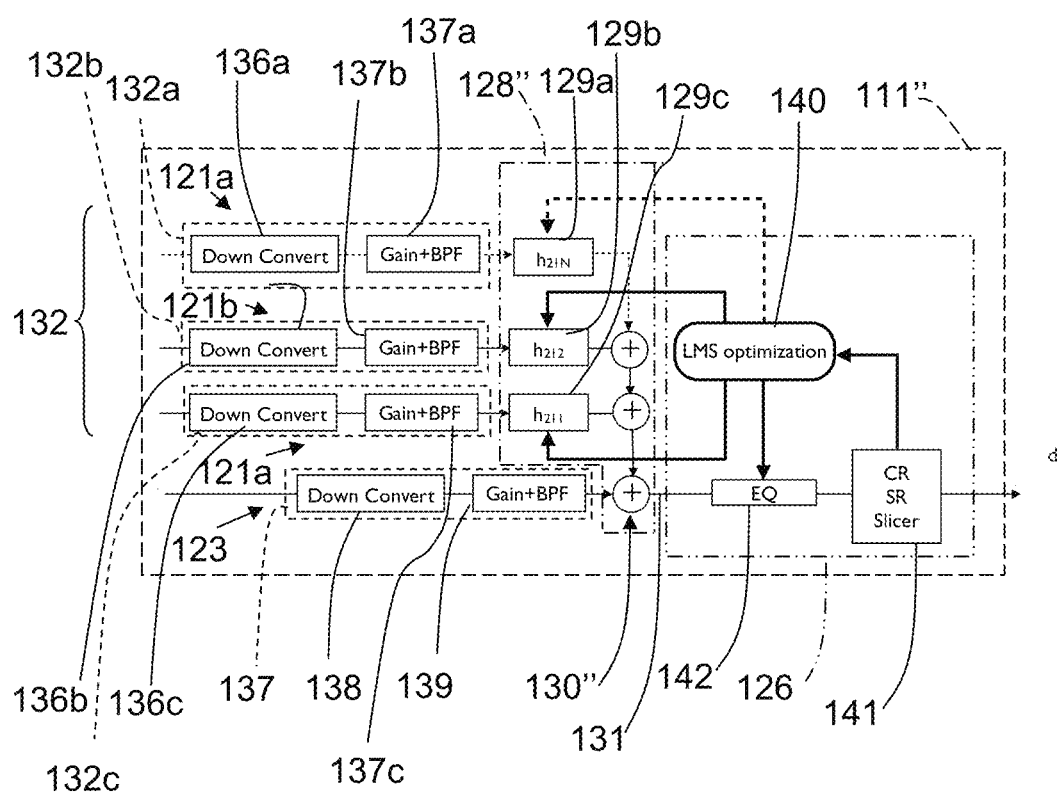

With reference to FIG. 5, each cancelling device 111" comprises an antenna receiver arrangements that comprises a plurality of antenna receivers 132a, 132b, 132c with corresponding first down-converting devices 136a, 136b, 136c and first band pass filters 137a, 137b, 137c in corresponding antenna branches 121a, 121b, 121c.

Said cancelling device 111" comprises a feedback loop arrangement 128" that in turn comprises an equalization device 129a, 129b, 129c for each antenna branch 121a, 121b, 121c and a combiner arrangement 130". I the same way as in the previous example, the combiner arrangement 130" is adapted to add conduit signal components and adapted antenna signal components for each antenna branch 121a, 121b, 121c, and to output a combined signal that is input the signal quality device 126. Recovered conduit signal components 125 are output from the cancelling device 111".

Figure 6:
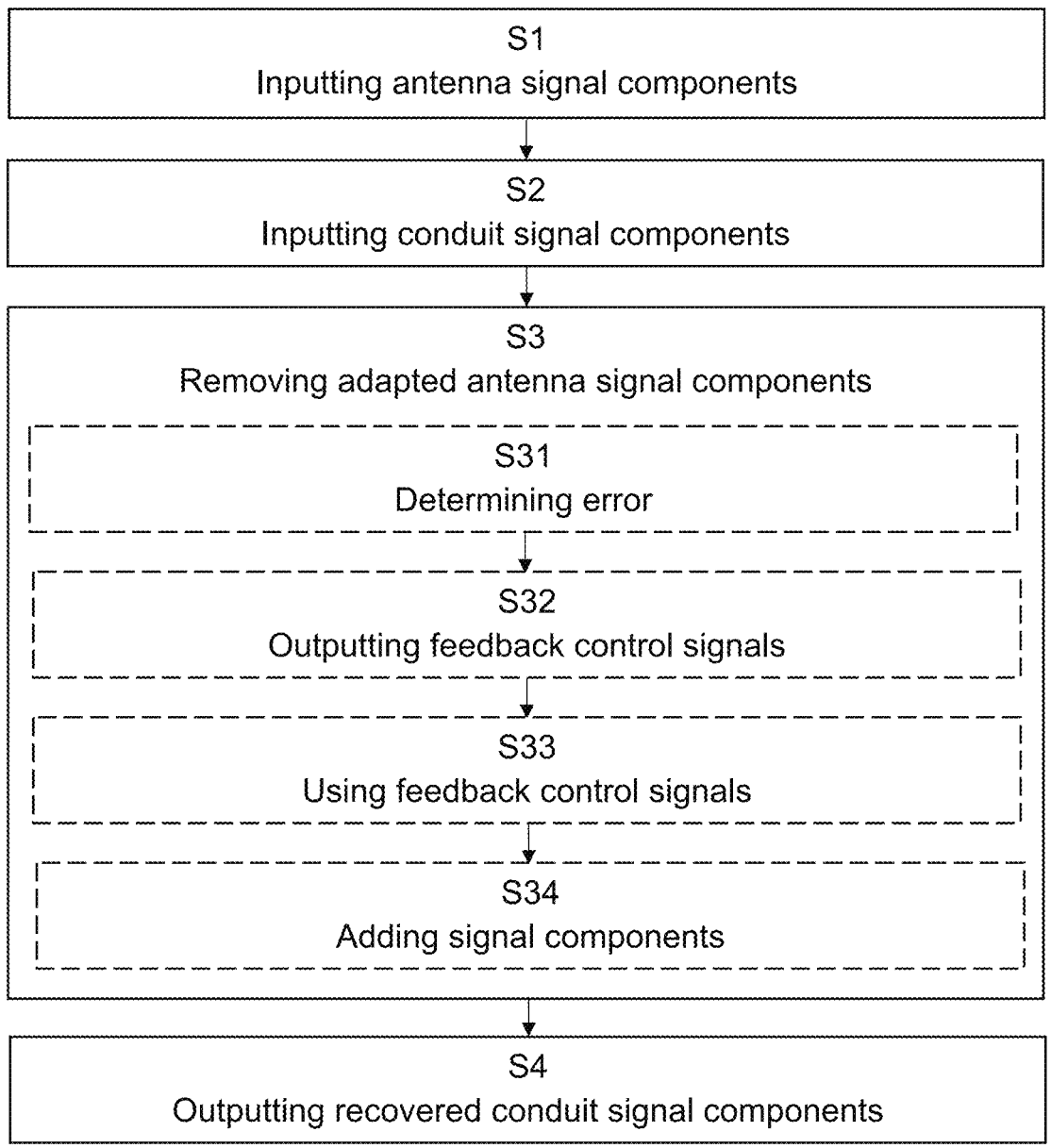
FIG. 6 is a flow chart illustrating methods.

With reference to FIG. 6, the present disclosure relates to a method for transmitting electromagnetic surface wave signals via a surface wave conduit 110. The method comprises inputting 51 antenna signal components 120 from a corresponding antenna arrangement 107, 108 in at least one antenna branch 121 and inputting S2 conduit signal components 122 from the surface wave conduit 110 in a conduit branch 123. The method further comprises removing S3 adapted antenna signal components 124 from the conduit signal components 122 such that recovered conduit signal components 125 are obtained, and outputting S4 the recovered conduit signal components 125.

According to some aspects, the surface wave conduit 110 is a power line wire.

According to some aspects, the method comprises determining S31 an error to be minimized; outputting S32 feedback control signals 127 and using S33 the feedback control signals 127 for affecting phase and amplitude of the antenna signal components 120 so as to form the adapted antenna signal components 124. The method further comprises adding S34 the conduit signal components 122 and the adapted antenna signal components 124 and outputting a combined signal 131 that is used for determining the feedback control signals 127.

The present disclosure is not limited to the examples above, but may vary freely within the scope of the appended claims. For example, the surface wave communication system 101 comprises at least one interference cancelling system 105, 106, and there may be converter bridges at poles without an interference cancelling system. There may be any number of interference cancelling systems between two wireless access points 102, 102'. There may be interference cancelling system at pole that comprises a wireless access point.

According to some aspects, at least one antenna arrangement 107, 108 comprises two or more separate antenna units 108a, 108b that are positioned apart from each other as schematically indicated for one antenna arrangement 108 in FIG. 1. The separate antenna units 108a, 108b are according to some aspects directed in different directions, and are according to some further aspects positioned at different heights.

According to some aspects, at least one antenna arrangement 107, 108 comprises an array antenna unit.

Generally, the present disclosure relates to a surface wave communication system 101 comprising a surface wave conduit 110 and being adapted for transmitting electromagnetic surface wave signals via the surface wave conduit 110. The surface wave communication system 101 further comprises at least one interference cancelling system 105, 106, where each interference cancelling system 105, 106 comprises an antenna arrangement 107, 108 and a cancelling device 111, 112. Each cancelling device 111, 112 is adapted to:

input antenna signal components 120 from the corresponding antenna arrangement 107, 108 in at least one corresponding antenna branch 121; 121a, 121b, 121c, input conduit signal components 122 from the surface wave conduit 110 in a conduit branch 123, remove adapted antenna signal components 124 from the conduit signal components 122 such that recovered conduit signal components 125 are obtained, and to output the recovered conduit signal components 125.

According to some aspects, the surface wave conduit 110 is a power line wire.

According to some aspects, each cancelling device 111, 112 comprises:

a signal quality device 126 that is adapted to determine an error to be minimized and to output feedback control signals 127, and a feedback loop arrangement 128, 128" that comprises an equalization device 129; 129a, 129b, 129c for each antenna branch 121; 121a, 121b, 121c and a combiner arrangement 130, 130", where each equalization device 129; 129a, 129b, 129c is adapted to be controlled by the feedback control signals 127 to affect phase and amplitude of the antenna signal components 120 so as to form the adapted antenna signal components 124, and where the combiner arrangement 130, 130" is adapted to add the conduit signal components 122 and the adapted antenna signal components 124, the combiner arrangement 130, 130" being adapted to output a combined signal 131 that is input the signal quality device 126.

According to some aspects, each cancelling device 111, 112; 111', 111" further comprises an antenna receiver arrangement 132 and a conduit receiver arrangement 133. The antenna receiver arrangement 132 is adapted to output the antenna signal components 120 from a received antenna signal 134, having been received by said antenna arrangement 107, and the conduit receiver arrangement 133 is adapted to output conduit signal components 122 from an electrical conduit signal 135.

According to some aspects, the surface wave communication system 101 further comprises a converter bridge 110a, 100b; 110c, 100d for each interference cancelling system 105, 106. Each converter bridge 110a, 100b; 110c, 100d comprises two surface wave converter units 110a,

100b; 110c, 100d, where each surface wave converter units 110a, 100b; 110c, 100d is adapted to convert a surface wave transferred via the surface wave conduit 110 to an electrical conduit signal 135 and/or to convert an electrical conduit signal 135 to a surface wave.

According to some aspects, the antenna receiver arrangement 132 comprises at least one antenna receiver 132; 132a, 132b, 132c, where each antenna receiver 132; 132a, 132b, 132c comprises a first down-converting device 136; 136a, 136b, 136c, adapted to convert signal carrier frequencies to corresponding base band frequencies, and a first band pass filter 137; 137a, 137b, 137c. The conduit receiver arrangement 133 comprises at least one conduit receiver 133, where each conduit receiver 133 comprises a second down-converting device 138, adapted to convert signal carrier frequencies to corresponding base band frequencies, and a second band pass filter 139.

According to some aspects, the signal quality device 126 comprises an error minimization unit 140, a data recovery arrangement 141 and an equalizer arrangement 142 that is connected between the combiner arrangement 130, 130' and the data recovery arrangement 141. The equalizer arrangement 142 is adapted to be controlled by the error minimization unit 140 to affect the frequency characteristics of the combined signal 131.

The invention claimed is:

1. A surface wave communication system comprising a surface wave conduit and being adapted for transmitting electromagnetic surface wave signals via the surface wave conduit, wherein the surface wave communication system further comprises at least one interference cancelling system, where each interference cancelling system comprises an antenna arrangement and a cancelling device, where each cancelling device is adapted to:
   input antenna signal components from the corresponding antenna arrangement in at least one corresponding antenna branch,
   input conduit signal components from the surface wave conduit in a conduit branch,
   remove adapted antenna signal components from the conduit signal components such that recovered conduit signal components are obtained, and
   output the recovered conduit signal components,
wherein each cancelling device comprises:
   a signal quality device that is adapted to determine an error to be minimized and to output feedback control signals,
   a feedback loop arrangement that comprises an equalization device for each antenna branch and a combiner arrangement, where each equalization device is adapted to be controlled by the feedback control signals to affect phase and amplitude of the antenna signal components so as to form the adapted antenna signal components, and where the combiner arrangement is adapted to add the conduit signal components and the adapted antenna signal components, the combiner arrangement being adapted to output a combined signal that is input to the signal quality device,
   an antenna receiver arrangement, and
   a conduit receiver arrangement,
   wherein the antenna receiver arrangement is adapted to output the antenna signal components from a received antenna signal, having been received by said antenna arrangement, and the conduit receiver arrangement being adapted to output conduit signal components from an electrical conduit signal, and
   wherein the antenna receiver arrangement comprises at least one antenna receiver, where each antenna receiver comprises a first down-converting device, adapted to convert signal carrier frequencies to corresponding base band frequencies, and a first band pass filter, and where the conduit receiver arrangement comprises at least one conduit receiver, where each conduit receiver comprises a second down-converting device, adapted to convert signal carrier frequencies to corresponding base band frequencies, and a second band pass filter.

2. The surface wave communication system according to claim 1, wherein the at least one antenna arrangement comprises an array antenna unit.

3. The surface wave communication system according to claim 1, wherein the surface wave conduit is a power line wire.

4. The surface wave communication system according to claim 1, wherein at least one antenna arrangement comprises two or more separate antenna units that are positioned apart from each other.

5. A surface wave communication system comprising a surface wave conduit and being adapted for transmitting electromagnetic surface wave signals via the surface wave conduit, wherein the surface wave communication system further comprises at least one interference cancelling system, where each interference cancelling system comprises an antenna arrangement and a cancelling device, where each cancelling device is adapted to:
   input antenna signal components from the corresponding antenna arrangement in at least one corresponding antenna branch,
   input conduit signal components from the surface wave conduit in a conduit branch,
   remove adapted antenna signal components from the conduit signal components such that recovered conduit signal components are obtained, and
   output the recovered conduit signal components,
wherein each cancelling device comprises:
   a signal quality device that is adapted to determine an error to be minimized and to output feedback control signals,
   a feedback loop arrangement that comprises an equalization device for each antenna branch and a combiner arrangement, where each equalization device is adapted to be controlled by the feedback control signals to affect phase and amplitude of the antenna signal components so as to form the adapted antenna signal components, and where the combiner arrangement is adapted to add the conduit signal components and the adapted antenna signal components, the combiner arrangement being adapted to output a combined signal that is input to the signal quality device,
   an antenna receiver arrangement, and
   a conduit receiver arrangement,
   wherein the antenna receiver arrangement is adapted to output the antenna signal components from a received antenna signal, having been received by said antenna arrangement, and the conduit receiver arrangement being adapted to output conduit signal components from an electrical conduit signal,
   wherein the surface wave communication system further comprises a converter bridge for each interference cancelling system where each converter bridge comprises two surface wave converter units, each surface wave converter units being adapted to convert a surface wave transferred via the surface wave conduit to an electrical conduit signal and/or to convert an electrical conduit signal to a surface wave.

6. The surface wave communication system according to claim 5, wherein the surface wave conduit is a power line wire.

7. The surface wave communication system according to claim 5, wherein the at least one antenna arrangement comprises an array antenna unit.

8. The surface wave communication system according to claim 5, wherein the at least one antenna arrangement comprises two or more separate antenna units that are positioned apart from each other.

9. A surface wave communication system comprising a surface wave conduit and being adapted for transmitting electromagnetic surface wave signals via the surface wave conduit, wherein the surface wave communication system further comprises at least one interference cancelling system, where each interference cancelling system comprises an antenna arrangement and a cancelling device, where each cancelling device is adapted to:
input antenna signal components from the corresponding antenna arrangement in at least one corresponding antenna branch,
input conduit signal components from the surface wave conduit in a conduit branch,
remove adapted antenna signal components from the conduit signal components such that recovered conduit signal components are obtained, and
output the recovered conduit signal components,
wherein each cancelling device comprises:
a signal quality device that is adapted to determine an error to be minimized and to output feedback control signals, and
a feedback loop arrangement that comprises an equalization device for each antenna branch and a combiner arrangement, where each equalization device is adapted to be controlled by the feedback control signals to affect phase and amplitude of the antenna signal components so as to form the adapted antenna signal components, and where the combiner arrangement is adapted to add the conduit signal components and the adapted antenna signal components, the combiner arrangement being adapted to output a combined signal that is input to the signal quality device,
wherein the signal quality device comprises an error minimization unit, a data recovery arrangement and an equalizer arrangement that is connected between the combiner arrangement and the data recovery arrangement, where the equalizer arrangement is adapted to be controlled by the error minimization unit to affect the frequency characteristics of the combined signal.

10. The surface wave communication system according to claim 9, wherein the surface wave conduit is a power line wire.

11. The surface wave communication system according to claim 9, wherein the at least one antenna arrangement comprises two or more separate antenna units that are positioned apart from each other.

12. The surface wave communication system according to claim 9, wherein the at least one antenna arrangement comprises an array antenna unit.

* * * * *